United States Patent [19]

Davies et al.

[11] Patent Number: 4,504,928
[45] Date of Patent: Mar. 12, 1985

[54] CURRENT RAMP GENERATOR

[75] Inventors: Robert B. Davies; Ira Miller, both of Tempe; Robert N. Dotson, Mesa, all of Ariz.

[73] Assignee: Motorola, Inc., Schaumburg, Ill.

[21] Appl. No.: 413,050

[22] Filed: Aug. 30, 1982

[51] Int. Cl.³ .................... G11C 19/08; H03K 4/08
[52] U.S. Cl. ........................................ 365/11; 307/228
[58] Field of Search ........................... 365/11; 307/228

[56] References Cited
U.S. PATENT DOCUMENTS
4,009,398 2/1977 Yamada et al. .................... 307/228

Primary Examiner—James W. Moffitt
Attorney, Agent, or Firm—William E. Koch

[57] ABSTRACT

A current ramp generator is provided for controlling the fall time of a bubble generate waveform of a bubble memory system. Gate circuitry is responsive to a digital input signal and provides an initializing signal to a current source. The current source charges a capacitor and thereby provides an increasing signal to a current mirror whose output sinks current from a control amplifier of the bubble memory system.

5 Claims, 3 Drawing Figures 4,504,928

CURRENT RAMP GENERATOR

BACKGROUND OF THE INVENTION

1. Field of the Invention

This invention relates, in general, to current ramp generators and more particularly to a circuit included in a bubble memory system that determines the fall time of a bubble generate waveform.

2. Background Art

Bubble memory systems normally include a control amplifier that produces a bubble generate waveform that, through additional circuitry, produces a magnetic bubble for storing information. In order to ensure that a bubble is produced, the waveform must meet specific criteria relating to duration and fall time. The fall time may typically be defined as that portion of the waveform from a point which is 90% of the peak amplitude to a point which is 10% of the peak amplitude.

Known bubble memory systems usually shape the bubble generate waveform by having external resistors and capacitors at the generate output. Waveshaping techniques in other applications have typically used complex circuits having a relatively large number of components wherein the components interact to shape the wave. However, these methods result in inefficiencies due to higher cost and larger space requirements.

Thus, what is needed is a current ramp generator that controls the fall time of the bubble generate waveform without external components.

SUMMARY OF THE INVENTION

Accordingly it is an object of the present invention to provide an improved current ramp generator.

Another object of the present invention is to provide a current ramp generator wherein the fall time of a bubble generate waveform from a control amplifier of a bubble memory system is determined without external components.

In carrying out the above and other objects of the invention in one form, there is provided an improved current ramp generator having a first voltage conductor, a second voltage conductor, an input signal conductor, and a current sinking conductor. A gate means is coupled to the input signal conductor and is responsive to a digital input for initializing a charging signal. A capacitive means is responsive to said gate means and provides an input to a current mirror whose output sinks current from the control amplifier of a bubble memory system and thereby controls the fall time of a bubble generate waveform.

The above and other objects, features, and advantages of the present invention will be better understood from the following detailed description taken in conjunction with the accompanying drawings.

DETAILED DESCRIPTION OF THE INVENTION

Bubble memory systems typically have a control amplifier that generates a waveform that produces, through additional circuitry, a magnetic bubble for storing information. In order to ensure that a bubble is properly produced, the waveform must meet specific criteria including a fall time defined by a certain time limit. For example, if a fall time is too short, two bubbles may be produced. The rise time of the waveform is determined by the control amplifier and the duration of the waveform is controlled by a propagation delay generator.

Figure 1:
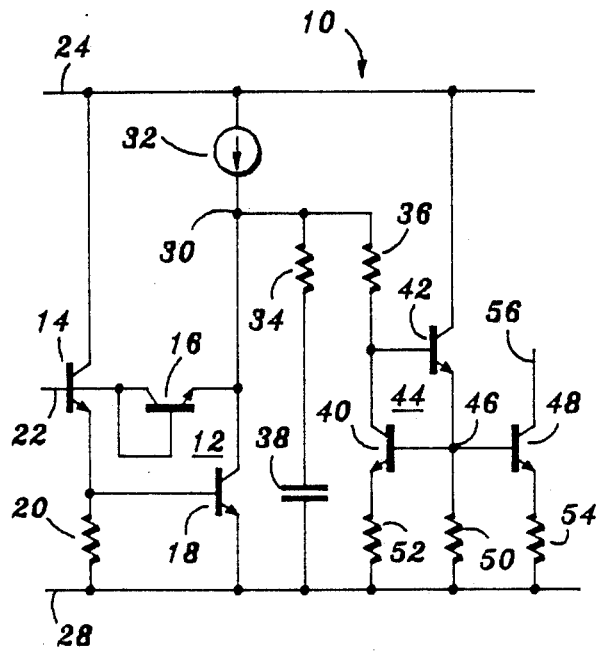
FIG. 1 is a schematic of the preferred embodiment of the invention.

Referring now to FIG. 1, a current ramp generator 10 is shown that is suitable to be fabricated in integrated circuit form as well as with discrete components. A gate 12, including transistors 14, 16, 18, and resistor 20, is responsive to an input signal on input conductor 22 to the base of transistor 14. The collector of transistor 14 is connected to a first voltage conductor 24 and the emitter of transistor 14 is coupled to second voltage conductor 28 by resistor 20. Voltage conductor 24 will have a more positive voltage than voltage conductor 28 using the NPN transistors as shown. Voltage conductor 28 may be grounded. The polarity of voltage conductors 24 and 28 may be reversed if other types of semiconductor devices are used. The base of transistor 14 is further connected to both the collector and base of diode connected transistor 16. The emitter of transistor 14 is further connected to the base of transistor 18. Transistor 18 has its emitter connected to voltage conductor 28 and its collector connected to both the emitter of transistor 16 and node 30. Node 30 is coupled to voltage conductor 24 by current source 32.

When the input signal to input conductor 22 of gate 12 is high, transistors 14 and 18 are turned on, thereby pulling node 30 to $1V_{BE}$. Diode connected transistor 16 pulls excess base drive from transistor 14, thereby holding transistor 18 at $1V_{BE}$ and preventing saturation thereof. When the input at input conductor 22 goes low, transistors 14 and 18 are turned off and current source 32 pulls node 30 high.

Node 30 is connected to both one terminal of resistor 34 and resistor 36. The other terminal of resistor 34 is coupled to voltage conductor 28 by capacitor 38. The other terminal of resistor 36 is connected to the collector of transistor 40 and the base of transistor 42 as an input to current mirror 44. Transistor 42 has its collector connected to voltage conductor 24 and its emitter connected to node 46. Node 46 is connected to the bases of transistors 40 and 48 and is coupled to voltage conductor by resistor 50. The emitters of transistors 40 and 48 are coupled to voltage conductor 28 by resistors 52 and 54, respectively. The collector of transistor 48 is connected to current sink conductor 56 which serves as the output for current ramp generator 10.

When node 30 goes high, current therefrom is divided along two paths to resistors 34 and 36. The majority of current flows through series connected resistor 34 and capacitor 38 until the capacitor is charged, then substantially all of the current flows to resistor 36 and current mirror 44. Current mirror 44 operates in typical fashion known to those skilled in the art wherein the current from resistor 36 is substantially matched at current sink conductor 56.

Figure 2:
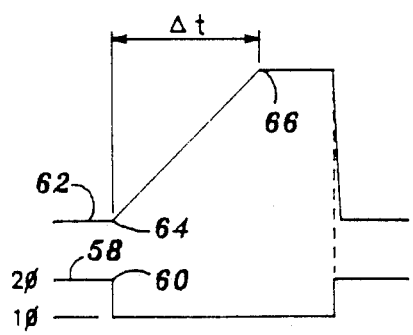
FIG. 2 is a diagram of the input and current sinking signals of the preferred embodiment of FIG. 1.

FIG. 2 illustrates the relationship of the input signal 58 at input conductor 22 and the current sink signal at current sink conductor 56. It is seen that when the input signal 58 goes low at point 60, the current sink signal 62 begins to rise at point 64 at a rate determined by the value of series connected resistor 34 and capacitor 38. When capacitor 38 has fully charged, the current sink signal 62 has reached its maximum value at point 66. This current sink signal 62 is summed at a controlling point in the control amplifier (not shown) of the bubble memory system and will cause the output current of the control amplifier to fall at the rate determined by the current ramp generator. In other words, the increased current from point 64 to point 66 is subtracted from a control point in the control amplifier, thereby causing the bubble generate waveform to fall at that rate.

Figure 3:
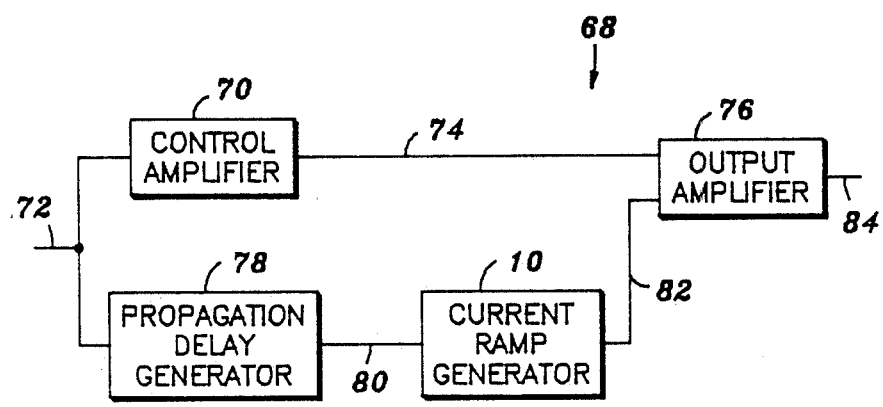
FIG. 3 is a block diagram of a bubble memory system that includes the preferred embodiment of the invention.

Referring to FIG. 3, a block diagram of bubble memory system 68 is shown that includes current ramp generator 10 of the present invention. Control amplifier 70 is coupled to receive controller signal 72 and generates bubble generate waveform 74 to output amplifier 76. Propagation delay generator 78 is coupled to receive controller input signal 72 and generates an input signal 80 to current ramp generator 10. Current ramp generator 10 is coupled to output amplifier 76 by current sinking conductor 82. Output amplifier 76 generates bubble memory generate gate signal 84.

Both control amplifier 70 and propagation delay generator 78 are initialized by controller signal 72. Propagation delay generator 78 delays this signal and initializes current ramp generator 10. The rise time of bubble memory generate gate signal 84 is then controlled by bubble generate waveform 74; its duration is controlled by the delay of propagation delay gate 78; and is fall time is controlled by the signal from current ramp generator 10.

By now it should be appreciated that there has been provided an improved current ramp generator that controls the fall time of a bubble generate waveform from a control amplifier of a bubble memory system.

Although the invention has been illustrated as having certain types of transistors, it will be understood that other types of transistors or semiconductor devices can be substituted to acheive the advantages of the present invention.

We claim:

1. A current ramp generator circuit having a first voltage conductor, a second voltage conductor, an input conductor responsive to an input signal, and a current sinking conductor, for controlling the ramp of a waveform, comprising:
   gate means coupled to said first voltage conductor, said second voltage conductor, and said input conductor, and responsive to said input signal for initializing a charging signal;
   capacitive means coupled to said first voltage conductor, said second voltage conductor and said gate means, and responsive to said charging signal for providing a signal; and
   current mirror means coupled to said first voltage conductor, said second voltage conductor, and said capacitive means and responsive to said charging signal for providing said current sinking signal.

2. The circuit according to claim 1 wherein said capacitive means comprises:
   a resistor having a first side and a second side, said first side coupled to said gate means; and
   a capacitor having a first side and a second side, said first side coupled to said second voltage conductor and said second side coupled to said second side of said resistor.

3. The circuit according to claim 2 wherein said gate means comprises:
   a first transistor having a base, collector, and emitter, said base coupled to said input conductor, said collector coupled to said first voltage conductor, said emitter coupled to said second voltage conductor;
   a second transistor having a base, collector, and emitter, said collector and base coupled together and to said base of said first transistor; and
   a third transistor having a base, collector, and emitter, said base coupled to said emitter of said first transistor, said emitter coupled to said second voltage conductor, said collector coupled to said emitter of said second transistor.

4. The circuit according to claim 2 wherein said current mirror means comprises:
   a first transistor having a base, collector, and emitter, said collector coupled to said capacitive means, said emitter coupled to said second voltage conductor;
   a second transistor having a base, collector, and emitter, said base coupled to said collector of said first transistor, said collector coupled to said first voltage conductor; and
   a third transistor having a base, collector, and emitter, said emitter coupled to said second voltage conductor, said collector coupled to said current sink conductor, said base coupled to said base of said first transistor, said emitter of said second transistor, and said second voltage conductor.

5. A current ramp generator in a bubble memory system having a control amplifier and a propagation delay generator, said control amplifier initiating a bubble generate waveform and said propagation delay generator generating an input signal, said current ramp generator having a first voltage conductor, a second voltage conductor, an input conductor responsive to said input signal, and a current sinking conductor coupled to said control amplifier, wherein the rise time of said bubble generate waveform is controlled by said control amplifier, the duration of said bubble generate waveform is controlled by said propagation delay generator, the fall time of said bubble generate waveform is controlled by said current ramp generator, said current ramp generator comprising:
   gate means coupled to said first voltage conductor, said second voltage conductor and said input conductor, and responsive to said input for initializing a charging signal;
   capacitive means coupled to said first voltage conductor, said second voltage conductor, and said gate means, and responsive to said charging signal for providing a signal; and
   current mirror means coupled to said first voltage conductor, said second voltage conductor, and said capacitive means, and responsive to said charging signal for providing a current sinking signal to said current sinking conductor.

* * * * *